United States Patent [19]
Kurita et al.

[11] 3,940,705
[45] Feb. 24, 1976

[54] AMPLIFYING CIRCUIT FOR PULSE SIGNALS

[75] Inventors: Shoichi Kurita, Kawasaki; Naohide Sata, Tokyo; Hideki Ogawa, Chiba; Yoshitaka Hiratsuka, Yokohama, all of Japan

[73] Assignee: Fujitsu Limited, Kawasaki, Japan

[22] Filed: Dec. 31, 1971

[21] Appl. No.: 207,451

[30] Foreign Application Priority Data
Dec. 21, 1970  Japan............................ 45-115431

[52] U.S. Cl................................... 330/16; 330/53
[51] Int. Cl.² ........................................ H03F 3/60
[58] Field of Search ............. 330/16, 53; 333/8, 29, 333/31, 32, 33

[56] References Cited
UNITED STATES PATENTS

| | | |
|---|---|---|
| 2,912,583 | 11/1959 | Geyer, Jr. ......................... 330/53 X |
| 3,168,656 | 2/1965 | Kobbe.............................. 333/32 X |
| 3,437,947 | 4/1969 | Beekman ............................. 330/20 |

*Primary Examiner*—James B. Mullins
*Attorney, Agent, or Firm*—Herbert L. Lerner

[57] ABSTRACT

An amplifying circuit for pulse signals comprises a plurality of delay lines and a plurality of transistor circuits. The base electrode of each transistor is grounded. Each of the delay lines has a delay time of td which can be expressed as tw < 2td, where tw is the duration of the pulses to be amplified. Each of the transistor circuits exhibits a short-circuit impedance for the first incident wave and exhibits the characteristic impedance for the second incident wave of opposite polarity from the first incident wave. The delay lines and the transistor circuits are connected in cascade.

2 Claims, 4 Drawing Figures

AMPLIFYING CIRCUIT FOR PULSE SIGNALS

The present invention relates to an amplifying circuit for pulse signals. More particularly, the invention relates to an amplifying circuit for pulse signals, which circuit comprises transistors and delay lines.

Various types of amplifying circuits for pulse signals have heretofore been provided, but all of them basically utilize the amplifying operation of transistors and the non-linear amplifying operation of amplifying pulse signals of a small level up to large pulses of a constant level by a switching operation using the pulse signal input. However, in order to obtain high speed switching operation of a transistor, it is necessary to connect a parallel circuit of a capacitor and a resistor in series to the base electrode of the switching transistor. The emitter electrode of the transistor is grounded or it is necessary to provide the bias setting to operate the transistor in the unsaturated region to shorten the turn-off time of the transistor.

An object of the invention is to provide an amplifying circuit for pulse signals, which circuit is of simple structure, but operates with efficiency, effectiveness and reliability.

Another object of the invention is to provide an amplifying circuit for pulse signals, which circuit operates differently from conventional amplifying circuits.

Still another object of the invention is to provide a novel amplifying circuit for pulse signals, comprising delay lines and transistors, which operates in the basically different manner from conventional amplifying circuits, that is, by amplifying pulses by the utilization of the reflection by the distributed constant line.

In accordance with the invention, the amplifying circuit for pulse signals comprises a plurality of delay lines and a plurality of transistor circuits. The base electrode of each transistor is grounded. Each of the delay lines has a delay time td which can be expressed as $tw < 2td$, where $tw$ is the duration of the pulses to be amplified. Each of the transistor circuits exhibits a short-circuit impedance for the first incident wave and a characteristic impedance for the second incident wave of opposite polarity from the first incident wave. The delay lines and the transistor circuits are connected in cascade.

In order that the invention may be readily carried into effect, it will now be described with reference to the accompanying drawing, wherein.

Figure 1:
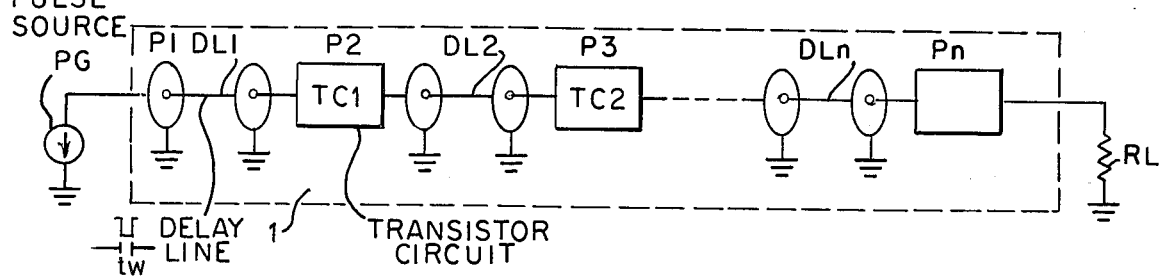
FIG. 1 is a block diagram of an embodiment of the amplifying circuit of the invention.

FIG. 1 is the amplifying circuit for pulse signals of the invention, comprising delay lines DL1, DL2, ... DLn having a characteristic impedance of Zo and transistor circuits TC1, TC2, ... TCn. Each of the transistor circuits TC1 to TCn comprises the circuit shown in FIG. 2. The delay lines DL1 to DLn and the transistor circuits TC1 to TCn are connected in cascade. In FIG. 1, a pulse connected source PG supplies current pulses. It is assumed that the output impedance is infinite. It is, of course, also possible to utilize a pulse voltage source having an internal impedance of the characteristic impedance Zo.

The duration of the pulses produced by the source PG is tw and the delay time of each of the delay lines DL1 to DLn is td. Pulse current I of negative polarity is supplied by the pulse current source PG to the transistor circuit TC1 through the delay line DL1. And the degree of amplification of the amplifying circuit 1 is determined by the number of stages of delay lines DL1 to DLn and transistor circuits TC1 to TCn connected in cascade.

Figure 2:
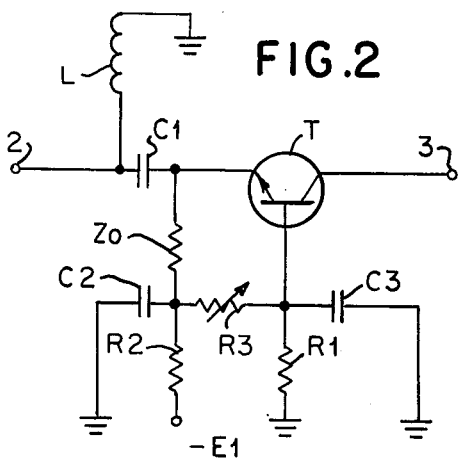
FIG. 2 is a circuit diagram of the transistor circuit of each amplifying stage of the amplifying circuit of the invention.

FIG. 2 shows an embodiment of each transistor circuit TC1 to TCn of the invention. An NPN type transistor T has an emitter electrode connected to an input terminal 2 via a capacitor C1. The transistor T has a base electrode connected to a point at ground potential via a biasing resistor R1. The transistor T has a collector electrode connected to an output terminal 3. The emitter electrode of the transistor T is connected to a source of negative voltage −E1 via an impedance Zo and a biasing resistor R2 connected in series.

The base electrode of the transistor T is connected to a common point in the connection of the impedance Zo and the resistor R2 via a variable biasing resistor R3. A capacitor C2 is connected between a common point in the connection of the impedance Zo and the resistor R2 and a point at ground potential. A capacitor C3 is connected between the base electrode of the transistor T and a point at ground potential. An inductance L is connected between a common point in the connection of the input terminal 2 and the capacitor C1 and a point at ground potential.

Figure 3:
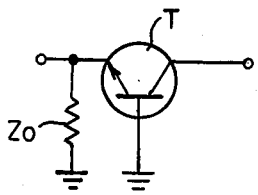
FIG. 3 is a circuit diagram of the equivalent circuit of the circuit of FIG. 2.

The time constant of the impedance Zo is 2L/Zo, which is selected to become sufficiently large compared with the duration of the input pulse. The time constants of the capacitors C1 to C3 are also selected so that the time constants may become sufficiently large compared with the duration of the pulse. The equivalent circuit of each of the transistor circuits TC1 to TCn is therefore a transistor circuit having a grounded base electrode, as shown in FIG. 3.

A small forward bias is applied between the base and emitter electrodes of the transistor T to such an extent that said transistor may always be in the cuf-off condition. Therefore, if a pulse input of negative polarity is applied to the transistor circuit TC1 to TCn, the circuit between the base and emitter electrodes is biased forwardly and the input impedance becomes very low. A short-circuit condition substantially occurs. If a pulse input of positive polarity is applied to the transistor circuit TC1 to TCn, the circuit between the base and emitter electrodes is reversely biased and therefore an open circuit condition occurs. The characteristic impedance Zo connected in parallel with the circuit between the base and emitter electrodes then becomes the input impedance.

Figure 4:
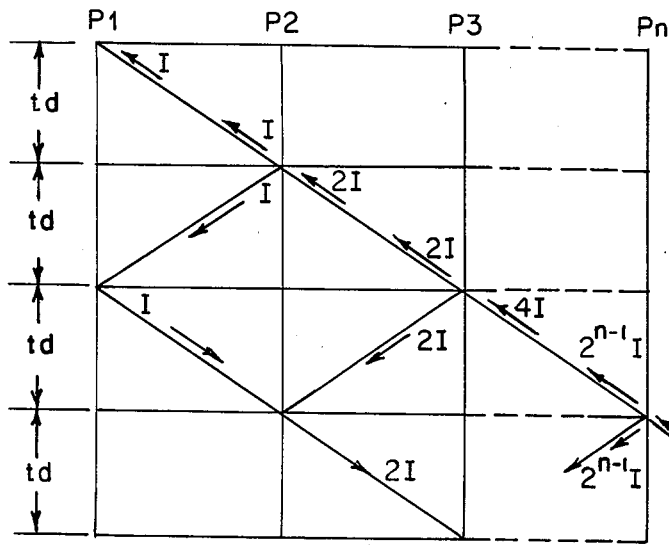
FIG. 4 is a time chart for explaining the operation of the amplifying circuit of FIG. 1.

The amplifying operation of the amplifying circuit of FIG. 1 is hereinafter described regarding a point P1 as a reference. Assuming that a negative current pulse I having a pulse duration tw is supplied to the point P1, as shown in FIG. 4, the current I is supplied to the transistor circuit TC1 through the delay line DL1 after a time $td$. As hereinbefore described, the grounded base transistor of the transistor circuit TC1 operates as a short-circuit input impedance for a pulse input of negative polarity, so that at a point P2 at said transistor a reflection coefficient of −1 is exhibited for the voltage incident wave and a reflection coefficient of +1 is exhibited for the current incident wave. The reflected wave is thus sent back to the input side, that is, the point P1 side. This may be expressed as $$V_{in} + V_R = 0 \quad (1)$$

$$I_{in} = \frac{V_{in}}{Zo} \quad (2)$$

$$I_R = \frac{-V_R}{Zo} \quad (3)$$

$$I_t = I_{in} + I_R \quad (4)$$

where $V_{in}$ is the incident voltage wave, $V_R$ is the reflected voltage wave, $I_{in}$ is the incident current wave, $I_R$ is the reflected current wave, and $I_t$ is the output current wave of the transistor circuit TC1. Substituting Equations (1), (2) and (3) in Equation (4), $$I_t = \frac{V_{in}}{Zo} - \frac{V_R}{Zo} = \frac{2V_{in}}{Zo} = 2I_{in} \quad (5)$$

Equation (5) indicates that $I_R + I_{in}$ is sent back to the input side as the reflected wave and, instead, current $2I_{in}$ flows into the transistor circuit as the transmitted wave. Then, after the lapse of a time $td$, the reflected wave is reflected again from the current pulse source PG toward the point P2 side because the voltage reflection coefficient of PG is +1 and the current reflection coefficient is −1. After the lapse of a time $td$, the reflected wave arrives at the point P2. The pulse which arrives at the point P2 is a pulse of positive polarity so that, as hereinbefore described, the transistor circuit has a characteristic impedance Zo. The matching condition is satisfied, the pulse is absorbed, and the reflection is not further repeated.

Therefore, a pulse amplification of gain 2 can be achieved by a single delay line DL1 to DLn and a single transistor circuit TC1 to TCn which are interconnected and form a single stage, the delay line having a delay time of $td$ which can be expressed at $tw < 2td$, where $tw$ is the duration of the pulse. A double pulse current output is therefore supplied from the transistor circuit TC1 to the following stages, each of which comprises a delay line and a transistor circuit interconnected in cascade.

Thus, as seen from FIG. 4, which shows the relation between the incident wave and the reflected wave, an amplifying circuit having a gain of $2^n$ may be constituted by the first to the $n$th stages interconnected in cascade, each comprising a transistor circuit and a delay line. In FIG. 4, the points P3 and Pn correspond to the points P3 and Pn of FIG. 1.

In an embodiment of the invention, various constants, as follows, could be obtained. An output or load resistor RL is connected to the output of the transistor circuit TCn, in FIG. 1. In an amplifying circuit comprising three transistor circuits TC1, TC2 and TC3, as shown in FIG. 2, connected in cascade through a delay line of 30 cm and having a characteristic impedance of 75 ohms, wherein the value of the variable resistor R3 varies from 100 to 200 ohms, the resistance value of the resistor R2 is 2 kilohms, the resistance value of the resistor R1 is 1 kilohm, each of the capacitors C1, C2 and C3 has a capacitance of 4700 micromicrofarads, the inductance value of the inductance is 3 millihenries, the voltage source −E1 is −15 volts, and the impedance Zo is 75 ohms, the input and output pulses have the following values. The amplitude of the input pulse is 1 volt, the pulse duration $tw$ is 1 nanosecond and the repetition period is 100 megahertz. The amplitude of the output pulse is 8 to 10 volts, but is variable in accordance with the resistance value of the variable resistor R3. The delay time of the output pulse from the input pulse is 4.5 nanoseconds.

As hereinbefore described, in the amplifying circuit for pulse signals of the present invention, since the delay time $td$ of the delay line is related to the pulse duration $tw$ as $tw < 2td$, the reflected wave and the incident wave are not overlapped. Since the transistor circuit exhibits a short-circuit input impedance for the first incident wave and exhibits a characteristic impedance for the second incident wave, waveform distortion due to multiple reflection may be eliminated. Furthermore, since the transistor utilized has a grounded base electrode, an amplification gain of 2 may be obtained with one stage, even when pulses having a very wide band frequency spectrum are utilized. Therefore, the desired gain may be obtained by connecting a plurality of stages in cascade. While the aforedescribed embodiment uses transistor circuits corresponding to negative polarity input pulses, transistor circuits corresponding to positive polarity input pulses may also be provided by utilizing, for example, PNP transistors, whereby the aforedescribed characteristic may be provided.

The current pulse source PG of FIG. 1 may be replaced by a voltage pulse source having an output impedance equal to the characteristic impedance Zo of the delay line. The output impedance of the current pulse source is infinite.

While the invention has been described by means of a specific example and in a specific embodiment, it should not be limited thereto, for obvious modifications will occur to those skilled in the art without departing from the spirit and scope of the invention.

We claim:
1. An amplifying circuit for pulse signals, comprising a pulse signal input terminal for supplying pulse signals having a pulse duration $tw$;
a delay line having a predetermined characteristic impedance and a delay time $td$, the pulse duration $tw$ being less than $2td$;
a transistor having a grounded base electrode, an emitter electrode coupled to the input terminal via the delay line and a collector electrode;
an impedance having the value of the characteristic impedance of the delay line connected between the emitter and base electrodes of the transistor; and
an output terminal connected to the collector electrode of the transistor.

2. An amplifying circuit for pulse signals, comprising a plurality of delay lines each having a predetermined characteristic impedance and a delay time $td$;
a plurality of transistors connected alternately in cascade with the delay lines, each of the transistors having a grounded base electrode, an emitter electrode coupled to the delay line next-preceding it and a collector electrode connected to the delay line next-succeeding it;
a pulse signal input terminal coupled to the emitter electrode of a first of the plurality of transistors via a first of the plurality of delay lines for supplying pulse signals having a pulse duration $tw$ which is less than $2td$;

a plurality of impedances each having the value of the characteristic impedance of each delay line and each connected between the emitter and base electrodes of a corresponding one of the transistors; and an output terminal connected to the collector electrode of a last of the plurality of transistors.

* * * * *